(12) United States Patent
Matsubayashi et al.

(10) Patent No.: US 9,882,058 B2
(45) Date of Patent: Jan. 30, 2018

(54) SEMICONDUCTOR DEVICE

(71) Applicant: Semiconductor Energy Laboratory Co., Ltd., Atsugi-shi, Kanagawa-ken (JP)

(72) Inventors: Daisuke Matsubayashi, Atsugi (JP); Toshimitsu Obonai, Shimotsuke (JP); Noritaka Ishihara, Koza (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/258,466

(22) Filed: Apr. 22, 2014

(65) Prior Publication Data

US 2014/0326991 A1 Nov. 6, 2014

(30) Foreign Application Priority Data

May 3, 2013 (JP) .................. 2013-097199

(51) Int. Cl.
*H01L 27/12* (2006.01)
*H01L 29/786* (2006.01)

(52) U.S. Cl.
CPC .................. *H01L 29/7869* (2013.01)

(58) Field of Classification Search
CPC ........... H01L 21/0242; H01L 21/02422; H01L 21/02472; H01L 21/02483;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — David Vu
*Assistant Examiner* — Mouloucoulaye Inoussa
(74) *Attorney, Agent, or Firm* — Robinson Intellectual Property Law Office; Eric J. Robinson

(57) ABSTRACT

A semiconductor device in which variation in electrical characteristics between transistors is reduced is provided. A transistor where a channel is formed in an oxide semiconductor layer is included, and a concentration of carriers contained in a region where the channel is formed in the oxide semiconductor layer is lower than or equal to $1\times10^{15}/cm^3$, preferably lower than or equal to $1\times10^{13}/cm^3$, more preferably lower than or equal to $1\times10^{11}/cm^3$, whereby an energy barrier height which electrons flowing between a source and a drain should go over converges at a constant value. In this manner, a semiconductor device in which variation in the electrical characteristics between the transistors is inhibited is provided.

16 Claims, 12 Drawing Sheets

(58) Field of Classification Search
CPC ......... H01L 21/02488; H01L 21/02502; H01L 21/02554; H01L 21/02565; H01L 21/02667; H01L 29/7869; H01L 27/1214; H01L 29/045; H01L 29/24; H01L 21/02592; H01L 27/12
USPC ............. 257/43, E21.476, E29.296; 438/104
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,421,068 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0070351 A1* | 3/2008 | Oue .................... H01L 27/1255 438/155 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0090909 A1* | 4/2009 | Yamazaki ............... H01L 29/04 257/57 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051938 A1* | 3/2010 | Hayashi ............ H01L 29/78663 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0127521 A1* | 6/2011 | Yamazaki ......... H01L 21/02472 257/43 |
| 2012/0176183 A1* | 7/2012 | Tanaka ................ H01L 29/7838 327/534 |
| 2013/0075732 A1* | 3/2013 | Saito ................... H01L 29/7869 257/57 |
| 2013/0193434 A1 | 8/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 | 9/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", Journal of the SID, 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performace TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara. H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Daisuke Matsubayashi et al., "Conduction Band Lowering Effect in Crystalline Indium-Gallium-Zinc-Oxide Thin Film Transistors," ECS Transactions, vol. 54, No. 1, 2013, pp. 115-120.

Daisuke Matsubayashi et al., "Low turn-on voltage due to conduction band lowering effect in crystalline indium gallium zinc oxide transistors," JJAP, vol. 53, 2014, pp. 04EF02-1-04EF02-5.

\* cited by examiner 400 402 404

408

410a 410b 300 414

SEMICONDUCTOR DEVICE

BACKGROUND OF THE INVENTION

1. Field of the Invention

One embodiment of the invention disclosed in this specification relates to a semiconductor device and a manufacturing method thereof.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) is disclosed (e.g., see Patent Document 1).

REFERENCE

Patent Document

[Patent Document 1] Japanese Published Patent Application No. 2011-181801

SUMMARY OF THE INVENTION

In order to improve reliability of a semiconductor device or operate the semiconductor device stably, it is important to reduce variation in electrical characteristics between a plurality of transistors included in the semiconductor device.

Thus, an object of one embodiment of the present invention is to provide a novel semiconductor device. Another object of one embodiment of the present invention is to provide a semiconductor device including a transistor having reduced electrical characteristic variation.

Another object of one embodiment of the present invention is to provide a highly reliable semiconductor device.

Note that the descriptions of these objects do not disturb the existence of other objects. In one embodiment of the present invention, there is no need to achieve all the objects. Objects other than the above objects will be apparent from and can be derived from the description of the specification and the like.

A semiconductor device of one embodiment of the present invention includes a transistor in which a channel is formed in an oxide semiconductor layer, and a concentration of donors contained in a region where the channel is formed in the oxide semiconductor layer is lower than or equal to $1 \times 10^{15}/cm^3$, lower than or equal to $1 \times 10^{13}/cm^3$, or lower than or equal to $1 \times 10^{11}/cm^3$, whereby electrical characteristics between the plurality of transistors converge at a constant value. More specifically, the following structures can be employed for example.

One embodiment of the present invention is a semiconductor device including a gate electrode layer, an oxide semiconductor layer overlapping with the gate electrode layer, a gate insulating layer between the gate electrode layer and the oxide semiconductor layer, and a source electrode layer and a drain electrode layer overlapping with part of the oxide semiconductor layer. The donor concentration of a region where a channel is formed in the oxide semiconductor layer is lower than or equal to $1 \times 10^{15}/cm^3$. When energy at the bottom of the conduction band, a Fermi level, and an energy gap at a given point in the region where the channel is formed are set to $E_{c1}$, $E_{f1}$, and $E_{g1}$, respectively, the following Formula (1) is satisfied.

$$(E_{c1}-E_{f1}) < E_{g1}/2 \quad (1)$$

Another embodiment of the present invention is a semiconductor device including a gate electrode layer, an oxide semiconductor layer overlapping with the gate electrode layer, a gate insulating layer between the gate electrode layer and the oxide semiconductor layer, and a source electrode layer and a drain electrode layer overlapping with part of the oxide semiconductor layer. The donor concentration of a region where a channel is formed in the oxide semiconductor layer is lower than or equal to $1 \times 10^{15}/cm^3$. When energy at the bottom of the conduction band, a Fermi level, and an energy gap at a given point in the region where the channel is formed are set to $E_{c1}$, $E_{f1}$, and $E_{g1}$, respectively, and energy at the bottom of the conduction band and a Fermi level at a given point in the region which overlaps with the source electrode layer or the drain electrode layer in the oxide semiconductor layer are set to $E_{c2}$ and $E_{f2}$, respectively, the following Formula (2) is satisfied.

$$(E_{c2}-E_{f2}) < (E_{c1}-E_{f1}) < E_{g1}/2 \quad (2)$$

Another embodiment of the present invention is a semiconductor device including a gate electrode layer, an oxide semiconductor layer overlapping with the gate electrode layer, a gate insulating layer between the gate electrode layer and the oxide semiconductor layer, and a source electrode layer and a drain electrode layer overlapping with part of the oxide semiconductor layer. The donor concentration of a region where a channel is formed in the oxide semiconductor layer is lower than or equal to $1 \times 10^{13}/cm^3$. When energy at the bottom of the conduction band and a Fermi level at a given point in the region where the channel is formed are set to $E_{c1}$ and $E_{f1}$, respectively, energy at the bottom of the conduction band and a Fermi level at a given point in the region which overlaps with the source electrode layer or the drain electrode layer in the oxide semiconductor layer are set to $E_{c2}$ and $E_{f2}$, respectively, a work function of the gate electrode layer is set to $\varphi_m$, the electron affinity of the oxide semiconductor layer is set to $\chi_{OS}$, a fixed charge of the gate insulating layer is set to $Q_{GI}$, the capacitance of the gate insulating layer is set to $C_{GI}$, and the capacitance of the oxide semiconductor layer is set to $C_{OS}$, the following Formula (3) is satisfied.

$$(E_{c2}-E_{f2}) < (E_{c1}-E_{f1}) \leq e(\varphi_m - \chi_{OS} - Q_{GI}/C_{GI}) \quad (3)$$

In any one of the above-described semiconductor devices, the oxide semiconductor layer preferably contains indium, gallium, and zinc.

Effects of the structure of one embodiment of the present invention can be described as follow. Note that the description given below is just a consideration.

A semiconductor device of one embodiment of the present invention includes a transistor in which a channel is formed in an oxide semiconductor layer, and the concentration of carriers contained in a region where the channel is formed in the oxide semiconductor layer is lower than or equal to $1\times10^{15}/\text{cm}^3$, lower than or equal to $1\times10^{13}/\text{cm}^3$, or lower than or equal to $1\times10^{11}/\text{cm}^3$, that is, the region is highly purified intrinsic or highly purified substantially intrinsic.

In the case where a highly purified intrinsic or highly purified substantially intrinsic oxide semiconductor layer is used as an oxide semiconductor layer, the Fermi level ($E_f$) of the channel formed in the oxide semiconductor layer is at the same level as a mid gap ($E_i$) or extremely close to the mid gap.

It seems intuitively that in the case where the Fermi level is at the same level as the mid gap, the height of an energy barrier which electrons flowing between a source and a drain should go over (also simply referred to as an energy barrier) is half the energy gap ($E_g$) of the oxide semiconductor layer ($=E_g/2$). The higher the energy barrier height which the electrons flowing between the source and the drain should go over is, the higher the gate voltage needed is; thus, the electrical characteristics of the transistor vary depending on the donor concentration (carrier concentration) of the oxide semiconductor layer. Specifically, as the donor concentration (carrier concentration) becomes lower, the rising voltage of drain current (Id)-gate voltage (Vg) characteristics is shifted to the positive direction.

However, in the actual measured result, the present inventors have confirmed that even in the case where a transistor including the highly purified intrinsic or highly purified substantially intrinsic oxide semiconductor layer is fabricated, drain current starts to flow when gate voltage is about 0 V in drain current-gate voltage characteristics (hereinafter also referred to as Id-Vg characteristics).

FIG. 5A shows Id-Vg characteristics of bottom-gate transistors in which oxide semiconductor layers applied to active layers have different donor concentrations. In FIG. 5A, six samples of a transistor whose channel width is 50 µm and channel length is 3 µm are fabricated by changing the donor concentration, and the characteristics are measured at the drain voltage (Vd) of 1 V.

FIG. 5B shows a relationship between the carrier concentration (n) and the threshold voltage (Vth) at the gate voltage of 0 V, which is derived from the Id-Vg characteristics shown in FIG. 5A.

FIG. 5B shows that even if the donor concentration of the oxide semiconductor layer is reduced, the threshold voltage shifts to the positive direction only up to a certain value. In addition, FIG. 5A shows that the Id-Vg characteristics of the transistors each including an oxide semiconductor layer with reduced donor concentrations almost overlap at any concentration, and normally-off characteristics in which the rising gate voltage converges at about 0 V can be obtained.

This indicates that in the transistor fabricated using the highly purified intrinsic or highly purified substantially intrinsic oxide semiconductor layer, the energy barrier which the electrons flowing between the source and the drain should go over is decreased, that is, the energy at the bottom of the conduction band (Ec) with respect to the Fermi level is decreased. Hereinafter, a phenomenon in which the energy at the bottom of the conduction band with respect to the Fermi level is decreased is called a conduction band lowering (CBL) effect.

As described above, owing to the CBL effect which is caused by reducing the donor concentration (carrier concentration) of the region where the channel is formed in the oxide semiconductor layer, the rising voltage of the Id-Vg characteristics converges at about 0 V. In other words, the electrical characteristics of the transistor including the oxide semiconductor layer can converge at a certain value. Thus, by using such an oxide semiconductor layer, a transistor with reduced variations and excellent uniformity can be provided.

According to one embodiment of the present invention, a novel semiconductor device can be provided. Furthermore, a semiconductor device having reduced electrical characteristic variation can be provided.

According to one embodiment of the present invention, a highly reliable semiconductor device can be provided.

DETAILED DESCRIPTION OF THE INVENTION

Figure 1A:
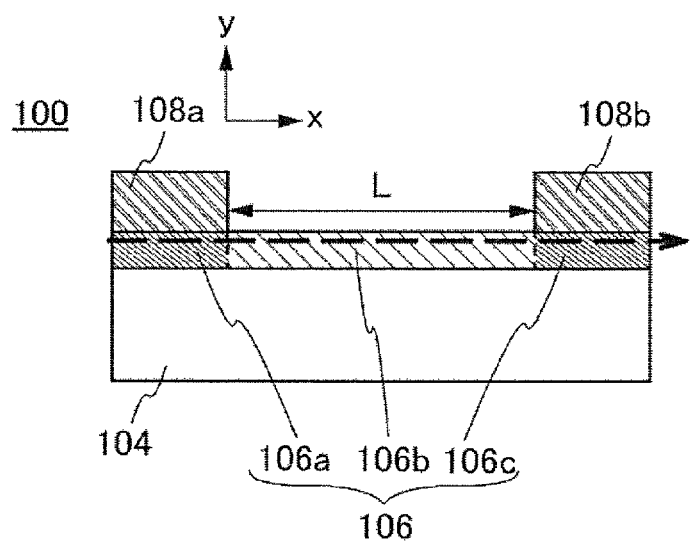
FIGS. 1A and 1B are a cross-sectional view and an energy band diagram of a semiconductor device of one embodiment of the present invention.

Embodiments of the present invention will be described below in detail with reference to the drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such a scale.

In this specification and the like, ordinal numbers such as "first" and "second" are used in order to avoid confusion among components, and the terms do not limit the components numerically. Therefore, for example, description can be made even when "first" is replaced with "second" or "third", as appropriate.

Note that functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, a length of a region where a channel is formed (also referred to as a channel length) refers to a distance between a source electrode layer overlapping an oxide semiconductor layer and a drain electrode layer overlapping the oxide semiconductor layer.

In this specification and the like, when an oxide semiconductor layer is highly purified substantially intrinsic, the donor concentration of the oxide semiconductor layer is lower than or equal to $1 \times 10^{15}/cm^3$ or lower than or equal to $1 \times 10^{13}/cm^3$.

In this specification and the like, when an oxide semiconductor layer is highly purified substantially intrinsic, the carrier concentration of the oxide semiconductor layer is lower than or equal to $1 \times 10^{15}/cm^3$, lower than or equal to $1 \times 10^{13}/cm^3$, or lower than or equal to $1 \times 10^{11}/cm^3$. A carrier concentration in this specification refers to a concentration of carriers contained in an oxide semiconductor layer (semiconductor) of a semiconductor device having a metal oxide semiconductor (MOS) structure when a potential of 0 V is applied to a gate electrode (metal). The carrier concentration can be measured by capacitance voltage (CV) measurement, for example.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification and the like, the trigonal and rhombohedral crystal systems are included in the hexagonal crystal system.

Embodiment 1

In this embodiment, a CBL effect and a semiconductor device in which the CBL effect occurs are described with reference to FIGS. 1A and 1B, FIGS. 2A and 2B, FIG. 3, and FIGS. 4A to 4C. As an example of the semiconductor device, a bottom-gate transistor is used in this embodiment. Note that the structure of one embodiment of the present invention is not limited thereto.

Figure 1B:
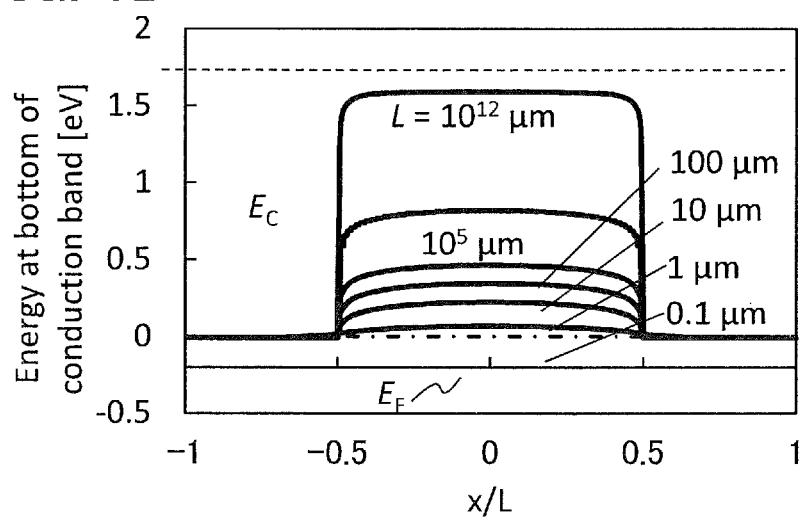

First, with the use of a semiconductor device 100 in FIG. 1A, an energy band structure in a direction in which carriers flow (a channel length direction) of a region where a channel is formed in an oxide semiconductor layer included in a semiconductor device is described. FIG. 1B shows an energy band structure of the conduction band of the semiconductor device 100 estimated by numerical calculation. The semiconductor device 100 in FIG. 1A is a bottom-gate transistor in which a gate electrode is not provided.

The semiconductor device 100 in FIG. 1A includes an oxide semiconductor layer 106 formed over an insulating layer 104 and a source electrode layer 108a and a drain electrode layer 108b which are in contact with part of the oxide semiconductor layer 106. Here, the calculation is performed on the assumption that a region 106b where a channel is formed in the oxide semiconductor layer 106 (a region between the source electrode layer 108a and the drain electrode layer 108b) is an intrinsic semiconductor (i). Moreover, in the oxide semiconductor layer 106, a region 106a in contact with the source electrode layer 108a and a region 106c in contact with the drain electrode layer 108b are each assumed to a low-resistance semiconductor (n$^+$ or n) having a donor concentration of $5 \times 10^{18}/cm^3$. Thus, the oxide semiconductor layer 106 has a n$^+$-i-n$^+$ homojunction.

Therefore, in the structure of FIG. 1A, when energy at the bottom of the conduction band and a Fermi level at a given point in the region where the channel is formed are represented as $E_{c1}$ and $E_{f1}$, respectively, and energy at the bottom of the conduction band and a Fermi level at a given point in the region which overlaps with the source electrode layer or the drain electrode layer in the oxide semiconductor layer are represented as $E_{c2}$ and $E_{f2}$, respectively, $(E_{c2}-E_{f2})<(E_{c1}-E_{f1})$ is satisfied.

In the calculation shown in FIGS. 1A and 1B, an In—Ga—Zn oxide semiconductor is used for the oxide semiconductor layer 106. It is assumed that an energy difference (energy gap) $E_g$ between the bottom of the conduction band and the top of the valence band of the oxide semiconductor layer is 3.2 eV, the relative dielectric constant $\in$ of the oxide semiconductor layer is $15\in_0$ ($\in_0$ is the vacuum dielectric constant), and the absolute temperature T is 300 K.

FIG. 1B shows a band structure of the conduction band of the semiconductor device 100 in FIG. 1A in a non-biased state (a state where potentials of the source electrode layer 108a and the drain electrode layer 108b are assumed to be 0 V) in a channel length direction along a dashed-line arrow, and the results when the channel lengths L are 0.1 μm, 1 μm, 10 μm, 100 μm, $10^5$ μm, and $10^{12}$ μm. The vertical axis in FIG. 1B indicates energy at the bottom of the conduction band ($E_c$) when a Fermi level ($E_f$) of the oxide semiconductor layer 106 is the origin, that is, the energy barrier height between the source and the drain, and the horizontal axis indicates the standardized channel length. Moreover, a dashed-dotted line in FIG. 1B indicates the Fermi level of the oxide semiconductor layer 106, and a dashed line indicates energy at the bottom of the conduction band (1.6 eV) when the Fermi level of the oxide semiconductor layer 106 corresponds to the mid gap ($E_i$) of the oxide semiconductor layer 106.

As shown in FIG. 1B, the longer the channel length is, the higher the energy barrier height between the source and the drain is. However, in this calculation, although the Fermi level is the same as the mid gap, the channel formation region is assumed to an intrinsic semiconductor; thus, in order that the energy barrier between the source and the drain is 1.6 eV which is half the energy gap ($E_g$) of the oxide semiconductor layer (=$E_g$/2), an unrealistic channel length of $10^{12}$ μm=1200 km is needed.

In FIG. 1B, an energy band of a channel formation region in the case where the channel length is $10^{12}$ μm is curved to the bottom side as the energy band approaches a n$^+$-i conjunction (x/L=−0.5 or x/L=0.5). The carrier concentration (n) of the portion where the energy band is curved is higher than the intrinsic carrier concentration ($n_i$) of $6.6 \times 10^{-9}/cm^3$; thus, in the region, carriers are stored.

The width of the portion where the band is curved is characterized by a Debye shielding length $\lambda_D=(\in_0 k_B T/e^2 n_i)^{1/2}$ with respect to the intrinsic carrier concentration ($n_i$). Note that $k_B$ represents a Boltzmann constant and e represents electronic elementary charge. Here, when permittivity $\in$ of $15\in_0$ of the oxide semiconductor layer and the absolute temperature T of 300 K are substituted, the Debye shielding length $\lambda_D$ is $5.7 \times 10^{10}$ μm=57 km, which is an extremely large value.

This indicates that in the semiconductor device 100 in FIGS. 1A and 1B, the carrier concentration of the region 106b which is a highly purified intrinsic (or highly purified substantially intrinsic) oxide semiconductor is extremely low; thus, an electric field from the region 106a which is an n+ layer to the region 106b enters 57 km without interruption. Furthermore, when the channel length is longer than $1.14 \times 10^{11}$ μm=114 km, which is twice as large as the Debye shielding length $\lambda_D$, an energy barrier height between the n− layer and the i layer is half the energy gap of the oxide semiconductor layer 106. As described above, in the case where the channel length is $10^{12}$ μm, the energy barrier between the source and the drain is 1.6 eV ($=E_g/2$), and L=$10^{12}$ μm=$2\lambda_D>1.14 \times 10^{11}$ μm is certainly satisfied.

On the other hand, when the channel length is shorter than $1.14 \times 10^{11}$ μm=114 km, which is twice as large as the Debye shielding length $\lambda_D$, electric fields from the region 106a and the region 106c which are n layers reach the center of the region 106b where the channel is formed without interruption, so that the energy barrier height is lowered. Thus, even when the region 106b is highly purified intrinsic or highly purified substantially intrinsic, that is, the Fermi level is positioned around the mid gap, the energy at the bottom of the conduction band with respect to the Fermi level is lowered, so that the energy barrier height is lowered. In other words, as long as the regions 106a and 106c which are n+ layers are provided under the source electrode layer 108a and the drain electrode layer 108b, in the channel length of a practical device, the energy barrier height is extremely lower than $E_g/2$.

Next, the CBL effect is examined with the use of a transistor structure having a gate electrode layer.

Figure 2A:
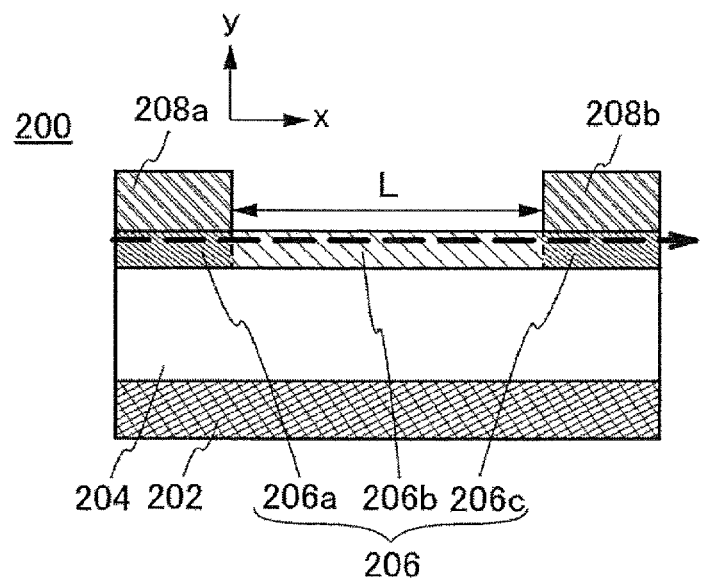
FIGS. 2A and 2B are a cross-sectional view and an energy band diagram of a semiconductor device of one embodiment of the present invention.

FIG. 2A illustrates a structure of a transistor 200 used for calculation. In FIG. 2A, a bottom-gate transistor including a gate electrode layer 202, a gate insulating layer 204 provided over the gate electrode layer 202, an oxide semiconductor layer 206 over the gate insulating layer 204, and a source electrode layer 208a and a drain electrode layer 208b which are in contact with part of the oxide semiconductor layer 206 is illustrated. In a manner similar to that of FIGS. 1A and 1B, the calculation is performed on the assumption that a region 206b where a channel is formed in the oxide semiconductor layer 206 (a region between the source electrode layer 208a and the drain electrode layer 208b) is an intrinsic semiconductor (i). Moreover, in the oxide semiconductor layer 206, a region 206a in contact with the source electrode layer 208a and a region 206c in contact with the drain electrode layer 208b are each assumed to a low-resistance semiconductor (n+ or n) having a donor concentration of $5 \times 10^{18}/\text{cm}^3$.

Figure 2B:
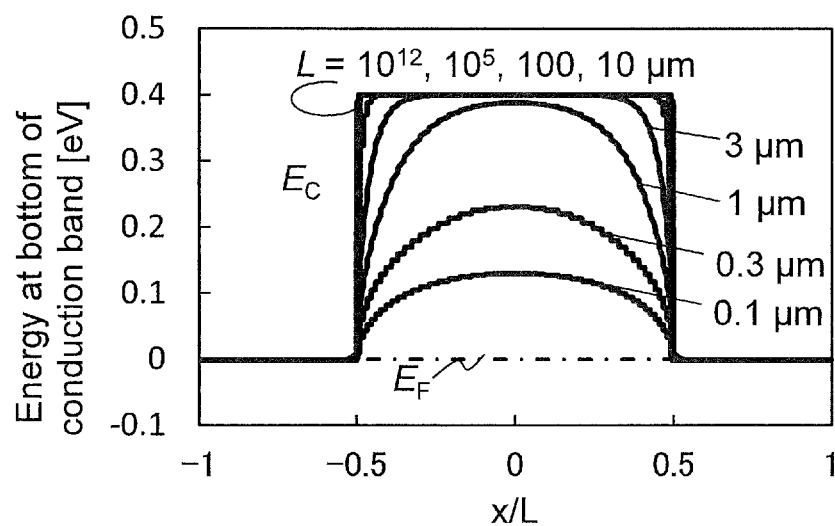

In the calculation shown in FIGS. 2A and 2B, an In—Ga—Zn oxide semiconductor is used for the oxide semiconductor layer 206, the energy gap ($E_g$) of the oxide semiconductor layer 206 is 3.2 eV, and the film thickness of the oxide semiconductor layer 206 is 35 nm. In addition, an equivalent oxide thickness (EOT) of the gate insulating layer 204 is assumed to 256 nm.

FIG. 2B shows calculation results of a band structure of the conduction band in FIG. 2A in a non-biased state (a state where potentials of the gate electrode layer 202, the source electrode layer 208a, and the drain electrode layer 208b are assumed to be 0 V) in a channel length direction along a dashed-line arrow. In FIG. 2B, the results when the channel lengths L are 0.1 μm, 0.3 μm, 1 μm, 3 μm, 10 μm, 100 μm, $10^5$ μm, and $10^{12}$ μm are shown. The vertical axis in FIG. 2B indicates energy at the bottom of the conduction band ($E_c$) when a Fermi level ($E_f$) of the oxide semiconductor layer 206 is the origin, that is, the energy barrier height between the source and the drain, and the horizontal axis indicates the standardized channel length. Moreover, a dashed-dotted line in FIG. 2B indicates the Fermi level of the oxide semiconductor layer 206.

The regions 206a and 206c overlapping with the source electrode layer 208a and the drain electrode layer 208b each have an n-type conductivity; thus, when energy at the bottom of the conduction band and a Fermi level at a given point in the region 206b where the channel is formed are set to $E_{c1}$ and $E_{f1}$, respectively, and energy at the bottom of the conduction band and a Fermi level at a given point in the regions 206a and 206c are set to $E_{c2}$ and $E_{f2}$, respectively, $(E_{c2}-E_{f2})<(E_{c1}-E_{f1})$ is satisfied (see FIG. 2B).

As shown in FIG. 2B, even in the case of providing the gate electrode layer 202, the energy barrier height ($E_{c1}-E_{f1}$) is lower than $E_g/2$ (1.6 eV) in the entire region of the channel formation region. In this manner, an influence of the CBL effect is found also in the calculation on the assumption that a transistor includes an oxide semiconductor layer.

In FIG. 2B, which is different from FIG. 1B in which the gate electrode layer is not assumed, the energy barrier height in the case where the channel length is long to some degree does not reach $E_g/2$ (1.6 eV); however, the energy barrier height is saturated at a certain value (in FIG. 2B, 0.4 eV when the channel length is 3 μm or more). This is because, in the case where the channel length is long to some degree, an influence of an electric field applied from the gate electrode layer 202 in a direction perpendicular to the region 206b where the channel is formed is stronger than an influence of an electric field from the regions 206a and 206c which are n+ layers to the region 206b.

On the other hand, in the case where the channel length is short (e.g., less than 3 μm), in a manner similar to that of the case where the gate electrode layer is not assumed, the influence of the electric field applied from the regions 206a and 206c which are n+ layers to the region 206b where the channel is formed is strong, so that the energy barrier height is further lowered than the above-described certain value.

Here, the energy barrier height (EBH) in the case where the channel length is long (e.g., longer than 3 μm) is represented by the following Formula (4).

$$\text{EBH} = e(\varphi_m - \chi_{OS} - Q_{GI}/C_{GI}) - [1/C_{GI} + 1/(2C_{OS})]e^2 N_d t \quad (4)$$

In Formula (4), $\varphi_m$ represents a work function of the gate electrode layer 202, $\chi_{OS}$ represents electron affinity of the oxide semiconductor layer 206, $Q_{GI}$ represents a fixed charge of the gate insulating layer 204, $C_{GI}$ represents capacitance of the gate insulating layer 204, $C_{OS}$ represents capacitance of the oxide semiconductor layer 206, t represents a film thickness of the oxide semiconductor layer 206, and $N_d$ represents the donor concentration of the region 206b. In the calculation, since $N_d$ is assumed to the intrinsic carrier concentration ($n_i$), $N_d$ is sufficiently low, and the second term of the right side of Formula (4) can be ignored. This calculation is performed with the use of 0.4 eV as $e(\varphi_m - \chi_{OS} - Q_{GI}/C_{GI})$; thus, in a transistor in which a channel length is too long to affect the electric field from the n+ layer, the energy barrier height is saturated to 0.4 eV. In other words, when the donor concentration is sufficiently low, the energy barrier height ($E_{c1} - E_{f1}$) converges at $e(\varphi_m - \chi_{OS} - Q_{GI}/C_{GI})$.

Figure 3:
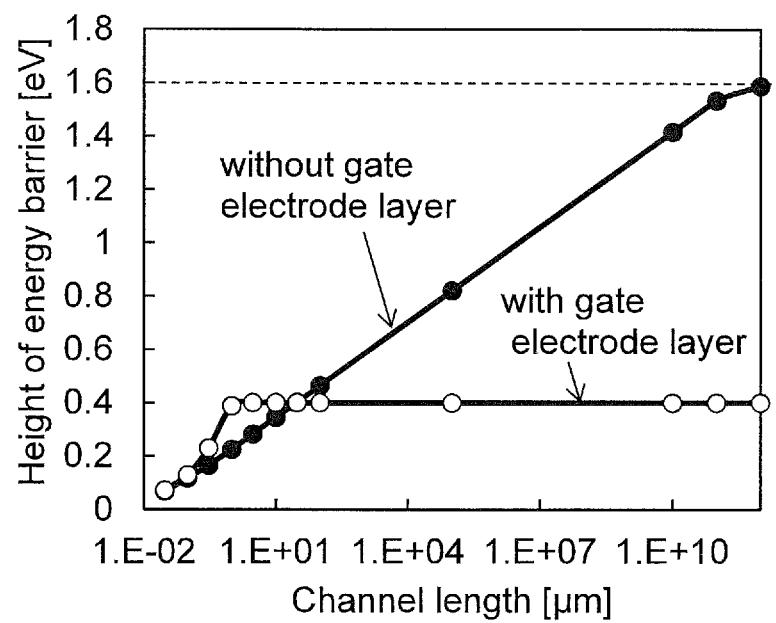
FIG. 3 shows a relationship between a channel length and an energy barrier height.

FIG. 3 shows channel length dependence of the energy barrier height calculated on the basis of the calculations of FIG. 1B and FIG. 2B. In FIG. 3, the vertical axis indicates an energy barrier height (an energy from the energy at the bottom of the conduction band to the Fermi level), and the horizontal axis indicates a channel length (μm).

As shown in FIG. 3, in the case where the gate electrode layer is not provided (corresponding to FIG. 1B), when the channel length is a long channel limit (a channel length longer than twice the above-described Debye shielding length $\lambda_D$), an energy barrier height is $E_g/2=1.6$ eV, and as the channel length is short, the energy barrier height is lowered.

In the case where the gate electrode layer is provided (corresponding to FIG. 2B), as the channel length is long, the influence of the electric field from the gate electrode layer in the perpendicular direction becomes stronger than that from the n$^+$ layer; thus, the energy barrier height is saturated at a certain value given by the first term of the right side of Formula (4). On the short channel side, the influence of the electric field from the n$^+$ layer is strong, so that the energy barrier height is further lowered.

Note that the energy barrier height shown in FIG. 3 determines threshold voltage of a transistor, and in an NMOS transistor, as the energy barrier is high, the threshold voltage of the transistor becomes high.

Next, in order to examine an influence of a donor concentration to an energy band diagram in the channel length direction, an energy band diagram in which the donor concentration of the region 206b where the channel is formed is increased when the channel length is 3 μm in the transistor 200 illustrated in FIG. 2A is calculated.

Figure 4A:
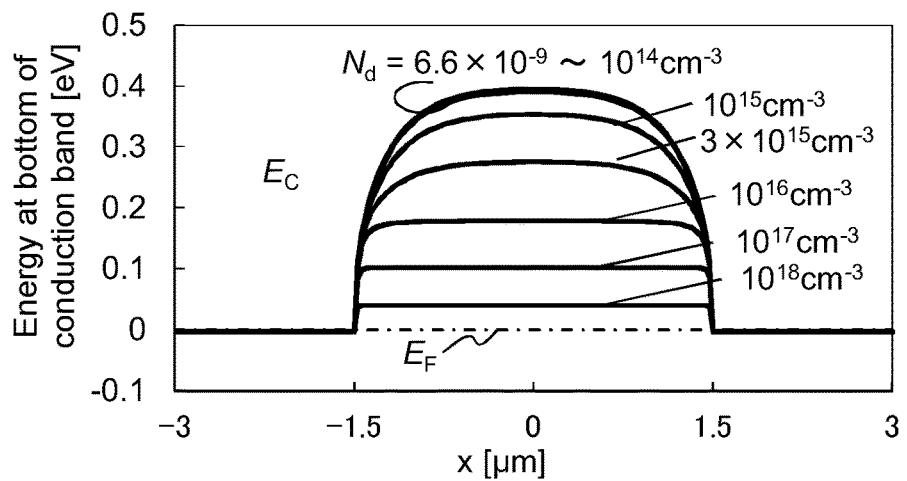
FIGS. 4A to 4C each show a relationship between a donor concentration and an energy barrier height or transistor characteristics.

FIG. 4A shows calculation results of a band structure of the conduction band in FIG. 2A in a non-biased state (a state where potentials of the gate electrode layer 202, the source electrode layer 208a, and the drain electrode layer 208b are assumed to be 0 V) in a channel length direction along the dashed-line arrow. In FIG. 4A, the calculation results when the donor concentration ($N_d$) is $6.6 \times 10^{-9}$/cm$^3$, $10^{14}$/cm$^3$, $10^{15}$/cm$^3$, $3 \times 10^{15}$/cm$^3$, $10^{16}$/cm$^3$, $10^{17}$/cm$^3$, and $10^{18}$/cm$^3$ are shown.

As shown in FIG. 4A, in the range of the donor concentration from $6.6 \times 10^{-9}$/cm$^3$ to $10^{14}$/cm$^3$, energy band diagrams correspond without change. That is, it is found that when the donor concentration of the channel formation region is sufficiently low (e.g., $1 \times 10^{15}$/cm$^3$ or lower or $1 \times 10^{13}$/cm$^3$ or lower), the band structure is not changed and the energy bather height is constant by the CBL effect caused by the electric field of the gate electrode layer. On the other hand, when the donor concentration is increased, the energy barrier height is decreased.

Figure 4B:
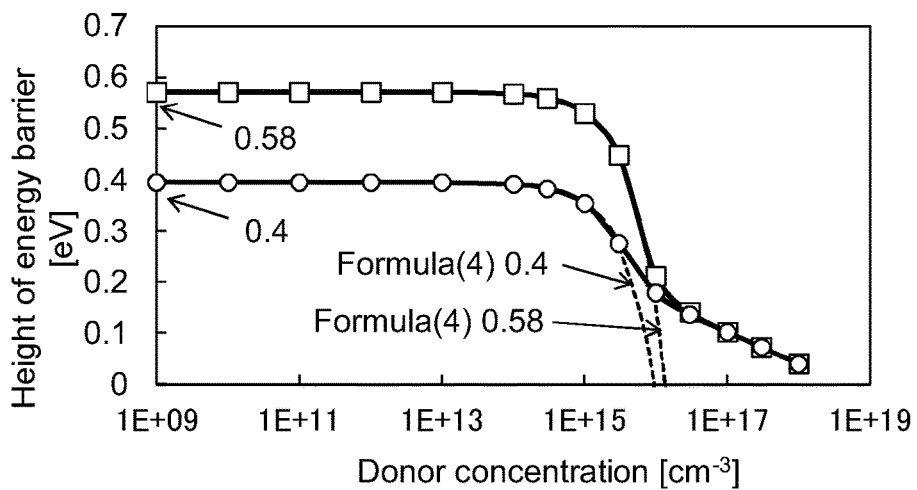
Figure 5A:
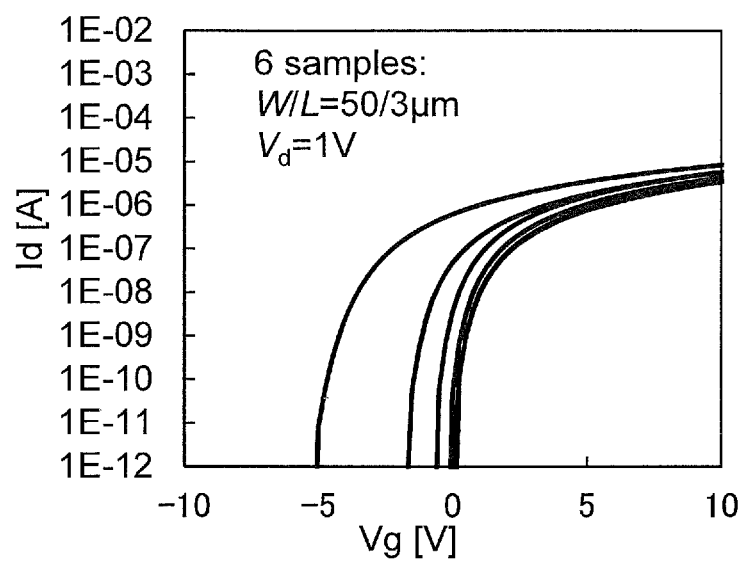
FIGS. 5A and 5B show a relationship between a carrier concentration and transistor characteristics.
Figure 5B:
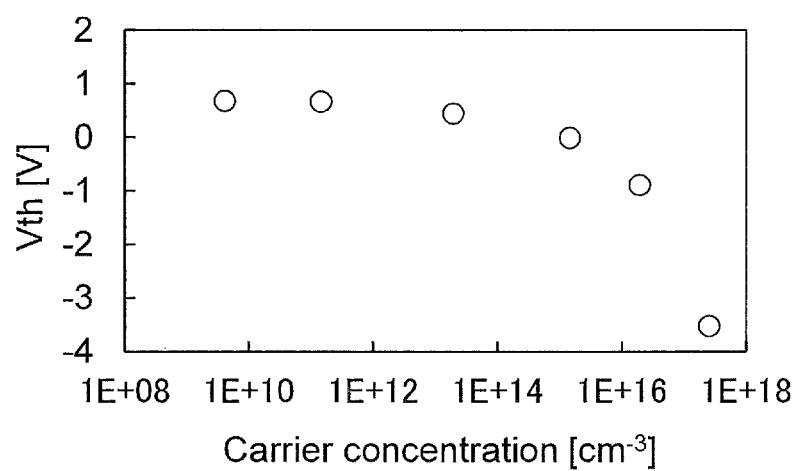

FIG. 4B shows a relationship between an energy bather height and donor concentration dependence. In FIG. 4B, the vertical axis indicates the energy barrier height, and the horizontal axis indicates the donor concentration of the region 206b where the channel is formed. FIG. 4B also shows a result when $e(\varphi_m-\chi_{OS}-Q_{GI}/C_{GI})$ of the first term of the right side of Formula (4) is 0.58 eV in addition to the result when $e(\varphi_m-\chi_{OS}-Q_{GI}/C_{GI})$ is 0.4 eV (corresponding to FIG. 4A). The value of $e(\varphi_m-\chi_{OS}-Q_{GI}/C_{GI})=0.58$ eV is a saturated value of the energy barrier height assumed from the measured transistor shown in FIGS. 5A and 5B.

Furthermore, dashed lines in FIG. 4B are approximate curves when $e(\varphi_m-\chi_{OS}-Q_{GI}/C_{GI})$ of the first term of the right side of Formula (4) is 0.4 eV or 0.58 eV and a value of $N_d$ is each substituted.

As shown in FIG. 4B, when the donor concentration of the channel formation region is approximately lower than or equal to $1 \times 10^{15}$/cm$^3$, the energy barrier height is constant. On the contrary, when the donor concentration is higher than $1 \times 10^{15}$/cm$^3$, as the donor concentration is increased, the energy barrier height is lowered.

Figure 4C:
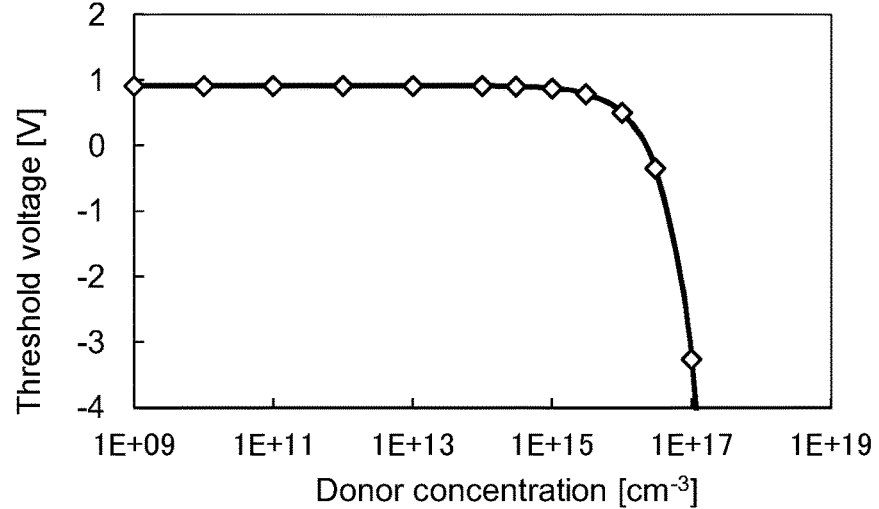

FIG. 4C shows a relationship between threshold voltage (Vth) of the transistor 200 in FIG. 2A and the donor concentration of the region 206b where the channel is formed. Note that in FIG. 4C, calculation is performed so that $e(\varphi_m-\chi_{OS}-Q_{GI}/C_{GI})=0.58$ eV.

As shown in FIG. 4C, when the donor concentration is lower than or equal to $1 \times 10^{15}$/cm$^3$, preferably lower than or equal to $1 \times 10^{13}$/cm$^3$, the threshold voltage is saturated at a certain value, regardless of the change in the donor concentration. The results are equal to the results of FIG. 4B. When the donor concentration of the channel formation region of the transistor is sufficiently low, the energy barrier height is saturated at a certain value (preferably $e(\varphi_m-\chi_{OS}-Q_{GI}/C_{GI})$). The threshold voltage of the transistor is determined by the energy barrier height, and as a result, the threshold voltage is also saturated at a certain value.

Figure 12:
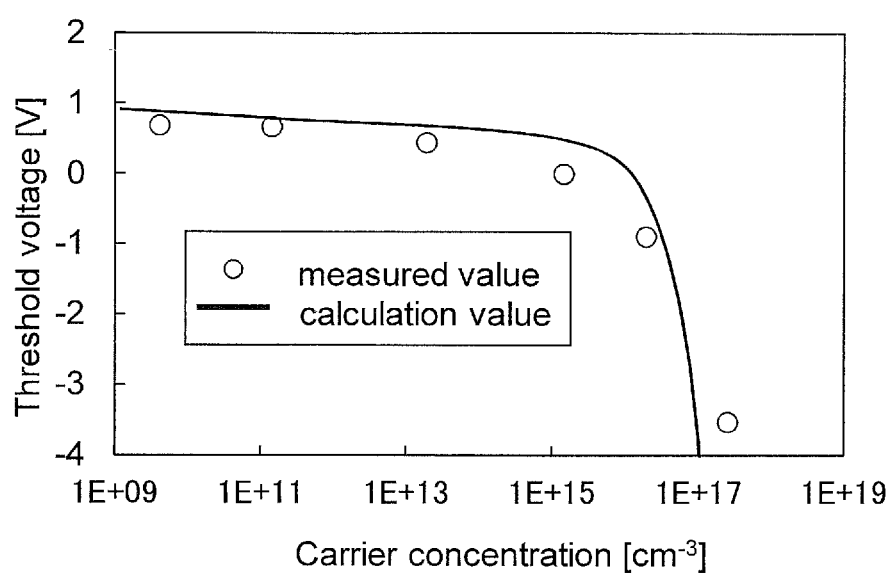
FIG. 12 shows a relationship between a carrier concentration and a transistor characteristic.

FIG. 12 shows a relationship between the threshold voltage (Vth) of the transistor 200 in FIG. 2A and the carrier concentration of the region 206b where the channel is formed. In FIG. 12, white circles represent the relationship between the measured carrier concentration and threshold voltage shown in FIG. 5B, and a solid line represent a relationship between the carrier concentration and threshold voltage which are calculated by calculation.

As shown in FIG. 12, the actual measured relationship between the calculated carrier concentration and threshold voltage can reappear in the calculation results. When the carrier concentration is lower than or equal to $1 \times 10^{15}$/cm$^3$, preferably lower than or equal to $1 \times 10^{13}$/cm$^3$, more preferably lower than or equal to $1 \times 10^{11}$/cm$^3$, the threshold voltage is saturated at a certain value, regardless of the change in the carrier concentration. A carrier concentration correlates with a donor concentration; thus, the results can be described in a manner similar to that of the results of FIG. 4C.

In this manner, the donor concentration and the carrier concentration of the region where the channel is formed in the oxide semiconductor layer are sufficiently reduced, whereby in the transistor using the oxide semiconductor layer, variation in the threshold voltage between the transistors can be inhibited by the CBL effect.

In one embodiment of the present invention, an oxide semiconductor layer including a region where a channel is formed is included, and the carrier concentration of the region where the channel is formed is lower than or equal to $1 \times 10^{15}$/cm$^3$, preferably lower than or equal to $1 \times 10^{13}$/cm$^3$, more preferably lower than or equal to $1 \times 10^{11}$/cm$^3$, whereby owing to the CBL effect, an energy difference ($E_c-E_f$) between an energy at the bottom of the conduction band in the region where the channel is formed and a Fermi level can be less than at least half the energy gap ($E_g$) of the region where the channel is formed ($=E_g/2$), preferably can converges at $e(\varphi_m-\chi_{OS}-Q_{GI}/C_{GI})$.

A transistor using such an oxide semiconductor layer for a channel is a transistor in which change in electrical characteristics is inhibited. Furthermore, the electrical characteristics in the transistors converge at a certain value, and variation in the electrical characteristics can be reduced. Thus, the reliability of the semiconductor device using the oxide semiconductor layer can be improved.

The structures, the methods, and the like described in this embodiment can be combined as appropriate with any of the structures, the methods, and the like described in the other embodiments.

Embodiment 2

In this embodiment, a detailed structure example of a semiconductor device including the highly purified intrinsic or highly purified substantially intrinsic oxide semiconductor layer described in Embodiment 1 and an example of a manufacturing method thereof are described with reference to drawings.

In this embodiment described below, a bottom-gate transistor is used for description; however, one embodiment of the present invention is not limited thereto, and this embodiment can be applied to a top-gate transistor, a multi-gate transistor, and the like. In addition, this embodiment can be applied to a channel protective transistor.

Figure 6A:
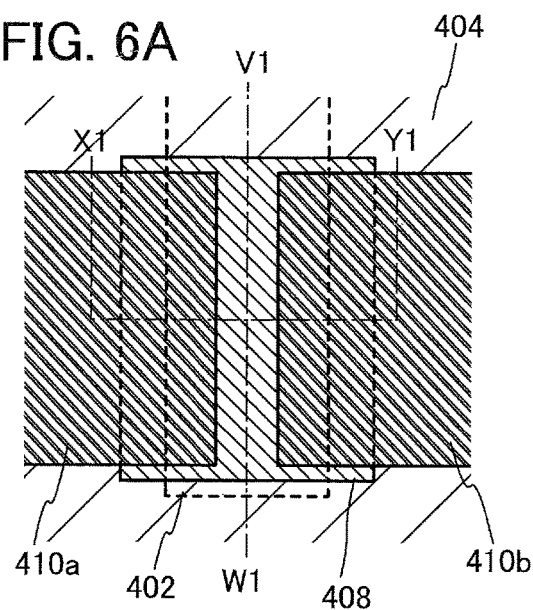
FIGS. 6A to 6C are a plan view and cross-sectional views illustrating a structure example of a semiconductor device of one embodiment of the present invention.
Figure 6C:
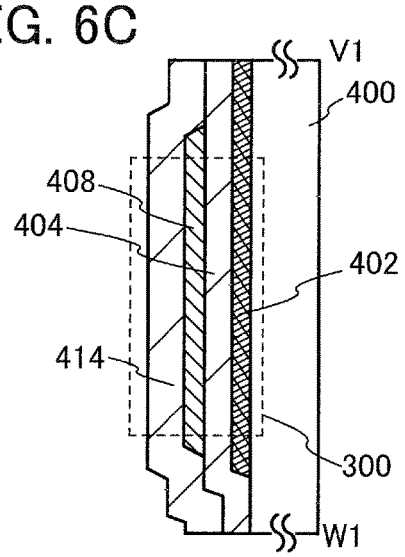
Figure 6B:
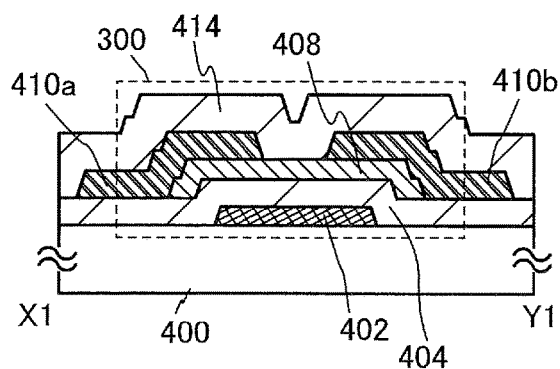

FIGS. 6A to 6C illustrate a structure example of a semiconductor device. FIG. 6A is a plan view of the transistor 300, FIG. 6B is a cross-sectional view taken along line X1-Y1 in FIG. 6A, and FIG. 6C is a cross-sectional view taken along line V1-W1 in FIG. 6A. Note that in FIG. 6A, some components (e.g., an insulating layer 414 and the like) are not illustrated to avoid complexity.

The transistor 300 illustrated in FIGS. 6A to 6C includes a gate electrode layer 402 provided over a substrate 400, a gate insulating layer 404 over the gate electrode layer 402, an oxide semiconductor layer 408 provided over the gate insulating layer 404 and overlapping with the gate electrode layer 402, and a source electrode layer 410a and a drain electrode layer 410b electrically connected to the oxide semiconductor layer 408.

Note that an insulating layer 414 which is provided over the oxide semiconductor layer 408, the source electrode layer 410a, and the drain electrode layer 410b may be included in the transistor 300 as a component. As the insulating layer 414 in contact with a region where a channel is formed in the oxide semiconductor layer 408, an insulating layer containing oxygen (oxide insulating layer), in other words, an insulating layer which can release oxygen, is preferably used. This is because oxygen is supplied from the insulating layer 414 which can release oxygen to the channel of the oxide semiconductor layer 408, whereby oxygen vacancies in the oxide semiconductor layer 408 or at an interface of the oxide semiconductor layer 408 can be filled. Note that as the insulating layer capable of releasing oxygen, a silicon oxide layer, a silicon oxynitride layer, or an aluminum oxide layer can be used, for example.

In the region where the channel is formed in the oxide semiconductor layer 408, hydrogen is preferably reduced as much as possible. Specifically, in the oxide semiconductor layer 408, the hydrogen concentration which is measured by secondary ion mass spectrometry (SIMS) is set to $2 \times 10^{20}$ atoms/cm$^3$ or lower, preferably $5 \times 10^{19}$ atoms/cm$^3$ or lower, more preferably $1 \times 10^{19}$ atoms/cm$^3$ or lower, more preferably $5 \times 10^{18}$ atoms/cm$^3$ or lower, more preferably $1 \times 10^{18}$ atoms/cm$^3$ or lower, more preferably $5 \times 10^{17}$ atoms/cm$^3$ or lower, more preferably $1 \times 10^{16}$ atoms/cm$^3$ or lower.

The oxide semiconductor layer 408 in which oxygen vacancies are filled and the hydrogen is reduced can be referred to as a highly purified intrinsic or highly purified substantially intrinsic oxide semiconductor layer. A highly purified intrinsic or highly purified substantially intrinsic oxide semiconductor has few carrier generation sources, and thus has a low carrier density in some cases. The highly purified intrinsic or highly purified substantially intrinsic oxide semiconductor layer has a low density of defect states, which are factors of a donor, and accordingly can have a low density of trap states. Thus, when the oxide semiconductor is used for the channel of the transistor, owing to the CBL effect described in Embodiment 1, it is possible to lower an energy barrier height between a source and a drain to converge at a certain value (saturated value), so that variation in electrical characteristics between a plurality of transistors can be inhibited.

Further, the highly purified intrinsic or highly purified substantially intrinsic oxide semiconductor layer 408 has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor 300 whose channel region is formed in the oxide semiconductor layer 206 has a small variation in electrical characteristics and high reliability.

An oxide semiconductor layer is classified roughly into a non-single-crystal oxide semiconductor layer and a single-crystal oxide semiconductor layer. The non-single-crystal oxide semiconductor layer includes a c-axis aligned crystalline oxide semiconductor (CAAC-OS) layer, a polycrystalline oxide semiconductor layer, a microcrystalline oxide semiconductor layer, an amorphous oxide semiconductor layer, and the like. As the oxide semiconductor layer 408 included in the transistor 300 in this embodiment, a microcrystalline oxide semiconductor layer, which has a higher degree of atomic order and a lower density of defect states than the amorphous oxide semiconductor layer, is preferably used, and the CAAC-OS layer, which is an oxide semiconductor layer with a lower density of defect states than the microcrystalline oxide semiconductor layer, is more preferably used.

The CAAC-OS film and the microcrystalline oxide semiconductor layer are described in detail below.

The CAAC-OS film is one of oxide semiconductor layers including a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a deposition surface) or a top surface of the CAAC-OS film, and is arranged in parallel to the deposition surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the deposition surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a deposition surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with and in parallel to a normal vector of a deposition surface or a normal vector of a top surface. Thus, for example, in the case where a shape of the CAAC-OS film is changed by etching or the like, the c-axis might not be necessarily parallel to a normal vector of a deposition surface or a normal vector of a top surface of the CAAC-OS film.

Further, distribution of c-axis aligned crystal parts in the CAAC-OS film is not necessarily uniform. For example, in the case where crystal growth leading to the CAAC-OS film occurs from the vicinity of the top surface of the layer, the proportion of the c-axis aligned crystal parts in the vicinity of the top surface is higher than that in the vicinity of the deposition surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor layer having a low impurity concentration. The impurity is any of elements including hydrogen, carbon, silicon, a transition metal element, and the like, not the main components of the oxide semiconductor layer. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Further, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity. Note that the impurity contained in the oxide semiconductor layer might become a carrier trap or a source of carriers.

As described above, the CAAC-OS film is an oxide semiconductor layer having a low density of defect states. For example, oxygen vacancies in the oxide semiconductor film serve as carrier traps or serve as carrier generation sources when hydrogen is captured therein.

An oxide semiconductor layer having a low impurity concentration and a low density of defect states (having few oxygen vacancies), in other words, a highly purified intrinsic or highly purified substantially intrinsic oxide semiconductor layer has few carrier generation sources, and thus can have a low carrier density. Thus, a transistor using the oxide semiconductor layer rarely has negative threshold voltage (is rarely normally on). A highly purified intrinsic or highly purified substantially intrinsic oxide semiconductor layer has few carrier traps. Accordingly, the transistor using the oxide semiconductor layer has little variation in electrical characteristics and high reliability. Moreover, owing to the CBL effect, the electrical characteristics converge at a certain value, so that variation in the electrical characteristics between transistors can be reduced.

In a transistor using the CAAC-OS film, change in electrical characteristics due to irradiation with visible light or ultraviolet light is small.

In an image obtained with the TEM, crystal parts cannot be found clearly in the microcrystalline oxide semiconductor layer in some cases. In most cases, a crystal part in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor layer depending on an analysis method. For example, when the nc-OS film is subjected to structural analysis by an out-of-plane method with an XRD apparatus using an x-ray having a diameter larger than that of a crystal part, a peak that shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor layer that has high regularity as compared to an amorphous oxide semiconductor layer. Therefore, the nc-OS film has a lower density of defect states than an amorphous oxide semiconductor layer. Note that there is no regularity of crystal orientation between different crystal parts in the nc-OS film. Therefore, the nc-OS film has a higher density of defect states than CAAC-OS film.

Note that the oxide semiconductor layer 408 may be a stacked-layer film including two or more kinds of an amorphous oxide semiconductor layer, a microcrystalline oxide semiconductor layer, and a CAAC-OS film, for example.

An example of a method for manufacturing the semiconductor device shown in FIGS. 6A to 6C is described with reference to FIGS. 7A to 7D.

Figure 7A:
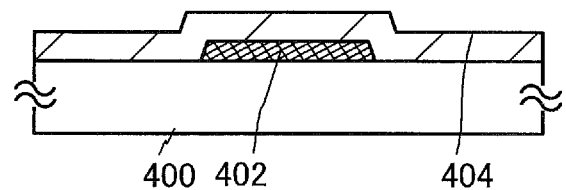
FIGS. 7A to 7D are cross-sectional views illustrating a method for manufacturing a semiconductor device of one embodiment of the present invention.

First, the gate electrode layer 402 (including a wiring formed using the same layer) is formed over the substrate 400, and the gate insulating layer 404 is formed over the gate electrode layer 402 (see FIG. 7A).

There is no particular limitation on the property of a material and the like of the substrate 400 as long as the material has heat resistance enough to withstand at least heat treatment to be performed later. For example, a glass substrate, a ceramic substrate, a quartz substrate, a sapphire substrate, or the like can be used as the substrate 400. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 400. Furthermore, any of these substrates further provided with a semiconductor element may be used as the substrate 400.

Alternatively, a flexible substrate may be used as the substrate 400, and the transistor 300 may be provided directly on the flexible substrate. Alternatively, a separation layer may be provided between the substrate 400 and the transistor 300. The separation layer can be used when part or the whole of a semiconductor device formed over the separation layer is completed and separated from the substrate 400 and transferred to another substrate. In such a case, the transistor 300 can be transferred to a substrate having low heat resistance or a flexible substrate.

A base insulating layer may be provided between the substrate 400 and the gate electrode layer 402. In the case where a substrate provided with a semiconductor element is used as the substrate 400, the base insulating layer can function as an interlayer insulating layer.

The gate electrode layer 402 can be formed using a metal material such as molybdenum, titanium, tantalum, tungsten, aluminum, copper, chromium, neodymium, or scandium or an alloy material that contains any of these materials as its main component. Alternatively, a semiconductor film typi- fied by a polycrystalline silicon film doped with an impurity element such as phosphorus, or a silicide film such as a nickel silicide film may be used as the gate electrode layer 402. The gate electrode layer 402 may have either a single-layer structure or a stacked-layer structure. The gate electrode layer 402 may have a tapered shape with a taper angle of greater than or equal to 15° and less than or equal to 70° for example. Here, the taper angle refers to an angle formed between a side surface of a layer having a tapered shape and a bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode layer 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode layer 402 is formed using any of these materials, the threshold voltage of the transistor can be positive, so that the transistor can be a normally-off switching transistor.

As the gate insulating layer 404, a film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. The gate insulating layer 404 may be formed with either a single-layer structure or a stacked-layer structure.

Note that in the gate insulating layer 404, a region to be in contact with the oxide semiconductor layer 408 which is formed later is preferably an oxide insulating layer and preferably has a region (oxygen excess region) containing oxygen in excess of the stoichiometric composition. In order to provide the oxygen excess region in the gate insulating layer 404, the gate insulating layer 404 may be formed in an oxygen atmosphere, for example. Alternatively, the oxygen excess region may be formed by introduction of oxygen into the gate insulating layer 404 after the film formation. Oxygen can be introduced by an ion implantation method, an ion doping method, a plasma immersion ion implantation method, plasma treatment, or the like.

Figure 7B:
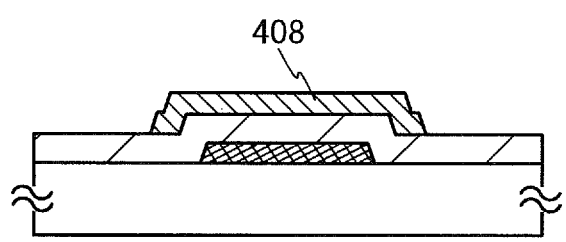

Next, an oxide semiconductor film is formed over the gate insulating layer 404 and processed into an island shape to form the oxide semiconductor layer 408 (see FIG. 7B). The oxide semiconductor layer 408 preferably includes a film represented by an In-M-Zn oxide that contains at least indium (In), zinc (Zn), and M (metal such as Al, Ga, Ge, Y, Zr, Sn, La, Ce, or Hf). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in the oxide semiconductor layer 408, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Z-based oxide may contain another metal element in addition to In, Ga, and Zn.

The oxide semiconductor layer 408 may have a single-layer structure or a stacked-layer structure of a plurality of oxide semiconductor layers. For example, the oxide semiconductor layer 408 may be a stacked layer of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using a three-component metal oxide.

Further, the constituent elements of the first oxide semiconductor layer and the second oxide semiconductor layer may be the same as each other but the composition of the constituent elements of the first oxide semiconductor layer and the second oxide semiconductor layer may be different from each other. For example, the first oxide semiconductor layer may have an atomic ratio of In:Ga:Zn=1:1:1, and the second oxide semiconductor layer may have an atomic ratio of In:Ga:Zn=1:3:2.

At this time, one of the first oxide semiconductor layer and the second oxide semiconductor layer, which is closer to the gate electrode (on a channel side) preferably contains In and Ga at a proportion of In≥Ga (the percentage of In is higher than or equal to the percentage of Ga). The other which is farther from the gate electrode (which is the back channel side) preferably contains In and Ga at a proportion of In<Ga (the percentage of Ga is higher than the percentage of In).

In an oxide semiconductor, the s orbital of heavy metal mainly contributes to carrier transfer, and overlap of the s orbitals is likely to increase when the In content in the oxide semiconductor is increased. Therefore, an oxide having a composition of In≥Ga has higher mobility than an oxide having a composition of In<Ga. Further, in Ga, the formation energy of oxygen vacancies is larger and thus oxygen vacancies are less likely to occur, than in In; therefore, the oxide having a composition of In<Ga has more stable characteristics than the oxide having a composition of In≥Ga.

An oxide semiconductor containing In and Ga at a proportion satisfying In≥Ga is used on a channel side, and an oxide semiconductor containing In and Ga at a proportion satisfying In<Ga is used on a back channel side, so that mobility and reliability of a transistor can be further improved.

Further, oxide semiconductor layers having different crystallinities may be used for the first oxide semiconductor layer and the second oxide semiconductor layer. That is, the oxide semiconductor layer may be formed using an appropriate combination of a single crystal oxide semiconductor layer, a polycrystalline oxide semiconductor layer, a microcrystalline oxide semiconductor layer, an amorphous oxide semiconductor layer, and a CAAC-OS film. Note that an amorphous oxide semiconductor layer is likely to absorb impurities such as hydrogen which serves as donors, and is likely to be n-type because oxygen vacancies are easily caused. Thus, the oxide semiconductor layer provided on the channel side is preferably formed using a crystalline oxide semiconductor film such as a CAAC-OS film.

The oxide semiconductor film can be formed by a sputtering method, a molecular beam epitaxy (MBE) method, a CVD method, a pulsed laser deposition method, an atomic layer deposition (ALD) method, or the like as appropriate.

In the formation of the oxide semiconductor film, the hydrogen concentration of the oxide semiconductor film is preferably reduced as much as possible. In order to reduce the hydrogen concentration, besides the high vacuum evacuation of the chamber, high purity of a sputtering gas is also needed when film formation is performed by a sputtering method, for example. As an oxygen gas or an argon gas used for a sputtering gas, a gas which is highly purified to have a dew point of −40° C. or lower, preferably −80° C. or lower, further preferably −100° C. or lower, further preferably −120° C. or lower is used, whereby entry of moisture or the like into the oxide semiconductor layer 408 can be prevented as much as possible.

In order to remove moisture remaining in the deposition chamber, an entrapment vacuum pump, such as a cryopump, an ion pump, or a titanium sublimation pump, is preferably used. The evacuation unit may be a turbo molecular pump provided with a cold trap. Since a cryopump has a high capability in removing a compound including a hydrogen atom such as a hydrogen molecule and water ($H_2O$) (preferably, also a compound including a carbon atom), the like, the concentration of an impurity contained in a film formed in the deposition chamber evacuated with the cryopump can be reduced.

Further, in the case where the oxide semiconductor film is formed by a sputtering method, the relative density (the fill rate) of a metal oxide target which is used for forming the oxide semiconductor film is greater than or equal to 90% and less than or equal to 100%, preferably greater than or equal to 95% and less than or equal to 99.9%. With the use of the metal oxide target having high relative density, a dense oxide film can be formed.

Note that formation of the oxide semiconductor film while the substrate 400 is kept at high temperature is also effective in reducing the impurity concentration of the oxide semiconductor film. The heating temperature of the substrate 400 may be higher than or equal to 150° C. and lower than or equal to 450° C., and preferably the substrate temperature is higher than or equal to 200° C. and lower than or equal to 350° C.

After forming the oxide semiconductor film or processing the oxide semiconductor layer 408 into an island shape, heat treatment is performed. The heat treatment is preferably performed at a temperature higher than or equal to 250° C. and lower than or equal to 650° C., preferably higher than or equal to 300° C. and lower than or equal to 400° C., more preferably higher than or equal to 320° C. and lower than or equal to 370° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By the heat treatment, impurities such as hydrogen and water can be removed from at least one of the oxide semiconductor layer 408 and the gate insulating layer 404. As described above, stable electrical characteristics can be effectively imparted to the transistor 300 in which an oxide semiconductor layer serves as a channel by reducing the concentration of impurities in the oxide semiconductor layer 408 to make the oxide semiconductor layer highly purified intrinsic or highly purified substantially intrinsic.

Figure 7C:
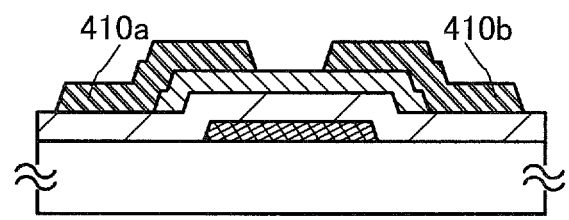

Next, a conductive film to be the source electrode layer 410a and the drain electrode layer 410b (including a wiring formed with the same layer) is formed over the oxide semiconductor layer 408, and is processed to form the source electrode layer 410a and the drain electrode layer 410b (see FIG. 7C).

Note that when a transistor with an extremely short channel length is formed, the source electrode layer 410a and the drain electrode layer 410b may be formed in such a manner that resist masks are processed by a method suitable for thin line processing, such as an electron beam exposure, and then etching treatment is performed. Note that with the use of a positive type resist for the resist masks, the exposed region can be minimized and throughput can be thus improved. In the above manner, a transistor with a channel length of 30 nm or less can be formed.

For the source electrode layer 410a and the drain electrode layer 410b, a conductive material which is easily bonded to oxygen can be preferably used. For example, Al, Cr, Cu, Ta, Ti, Mo, or W can be used. In particular, W with a high melting point is preferred because a relatively high process temperature can be employed in a later step. Note that the conductive material which is easily bonded to oxygen includes, in its category, a material to which oxygen is easily diffused.

When such a conductive material which is easily bonded to oxygen is in contact with the oxide semiconductor layer 408, oxygen in the oxide semiconductor layer 408 is taken into the conductive material. Some heating steps are performed in a manufacturing process of the transistor, and thus oxygen vacancies are generated in regions of the oxide semiconductor layer 408 which are in the vicinity of an interface between the oxide semiconductor layer 408 and each of the source electrode layer 410a and the drain electrode layer 410b, so that n-type regions are formed. The n-type regions can function as a source and a drain of the transistor 300.

Note that a constituent element of the source electrode layer 410a and the drain electrode layer 410b may enter the n-type regions. Further, a region having high oxygen concentration may be formed in part of the source electrode layer 410a and part of the drain electrode layer 410b, which are in contact with the n-type regions. A constituent element of the oxide semiconductor layer 408 may enter the source electrode layer 410a and the drain electrode layer 410b in contact with the n-type regions in some cases. That is, in the vicinity of the interface between the oxide semiconductor layer 408 and the source and drain electrode layers 410a and 410b, a portion which can be called a mixed region or a mixed layer of the two contacting layers is formed in some cases.

In a case of forming a transistor with an extremely short channel length, the n-type region that is formed by the generation of the oxygen vacancies sometimes extends in the channel length direction of the transistor. In that case, electrical characteristics of the transistor change; for example, the threshold voltage shifts or on/off of the transistor cannot be controlled with the gate voltage (i.e., the transistor is on). Accordingly, in the case of forming a transistor with an extremely short channel length, the conductive material which is not easily bonded to oxygen may be used for the source electrode and the drain electrode. As the conductive material, tantalum nitride, titanium nitride, or the like is preferably used, for example. Note that the conductive material which is not easily bonded to oxygen includes, in its category, a material to which oxygen is not easily diffused.

Figure 7D:
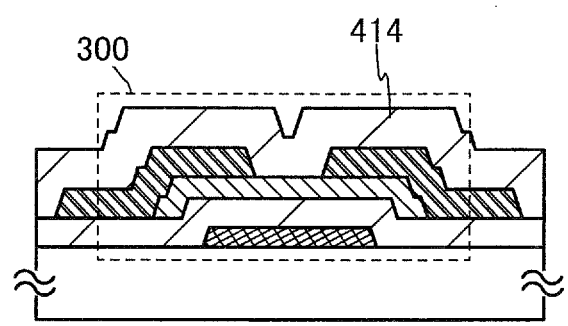

Next, the insulating layer 414 is formed over the oxide semiconductor layer 408, the source electrode layer 410a, and the drain electrode layer 410b (see FIG. 7D). As the insulating layer 414, an oxide insulating layer is preferably used, for example, a silicon oxide layer, a silicon oxynitride layer, or an aluminum oxide layer is preferably used.

In the case where an oxide insulating layer is provided as the insulating layer 414, heat treatment is preferably performed after the formation of the insulating layer 414. By the heat treatment, part of oxygen contained in the insulating layer 414 which is the oxide insulating layer can be moved to the oxide semiconductor layer 408, so that oxygen vacancies in the oxide semiconductor layer 408 can be filled. Consequently, oxygen vacancies in the oxide semiconductor layer 408 can be reduced. The heat treatment can be performed under conditions similar to those for the heat treatment performed after forming the oxide semiconductor film or processing into the island-shaped oxide semiconductor layer 408.

Alternatively, the insulating layer 414 may have a stacked structure. For example, a stacked structure of an oxide insulating layer in contact with the oxide semiconductor layer 408 and a nitride insulating layer over the oxide insulating layer may be used. As the nitride insulating layer, a silicon nitride layer, a silicon nitride oxide layer, or the like can be used.

In the above manner, the transistor 300 in this embodiment can be formed.

The transistor in this embodiment includes a highly purified intrinsic or highly purified substantially intrinsic oxide semiconductor layer which is formed by reducing impurities such as hydrogen in the oxide semiconductor layer where the channel is formed and compensating the oxygen vacancies. By using such an oxide semiconductor layer, a transistor in which change in electrical characteristics is inhibited can be provided. Furthermore, variation in the electrical characteristics between the transistors can be reduced. Therefore, a semiconductor device with high reliability can be provided.

The structures, the methods, and the like described in this embodiment can be combined as appropriate with any of the structures, the methods, and the like described in the other embodiments.

Embodiment 3

In this embodiment, a semiconductor device (memory device) which includes the transistor including the highly purified intrinsic or highly purified substantially intrinsic oxide semiconductor layer described in Embodiment 1, which can hold stored data even when not powered, and which has an unlimited number of write cycles is described with reference to drawings.

Figure 8A:
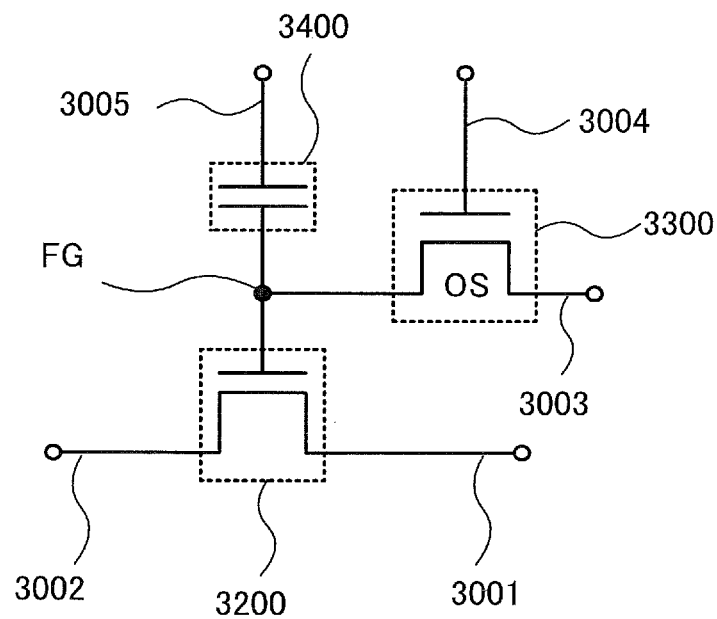
FIGS. 8A and 8B are circuit diagrams each illustrating an example of a memory device.

The semiconductor device illustrated in FIG. 8A includes a transistor 3200 including a first semiconductor material, a transistor 3300 including a second semiconductor material, and a capacitor 3400. As the transistor 3300, the transistor of one embodiment of the present invention which is described in the above embodiments can be used.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor memory device in which refresh operation is unnecessary or the frequency of refresh operation is extremely low can be provided.

In FIG. 8A, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200 is electrically connected to the other of the source electrode and the drain electrode of the transistor 3300 and the one electrode of the capacitor 3400. A fifth wiring 3005 is electrically connected to the other electrode of the capacitor 3400.

The semiconductor device in FIG. 8A utilizes a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in general, in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

Figure 8B:
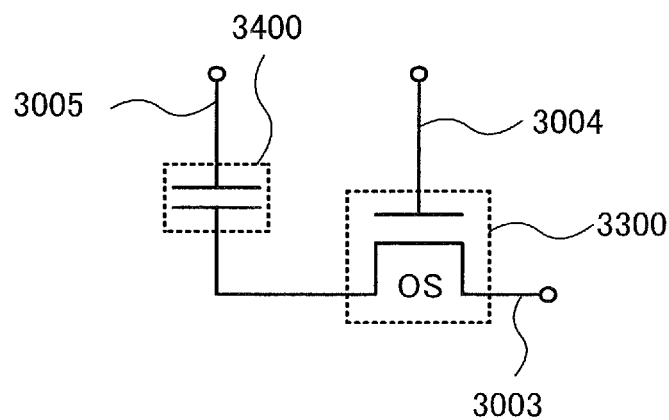

A semiconductor device illustrated in FIG. 8B is different from the semiconductor device illustrated in FIG. 8A in that the transistor 3200 is not provided. Also in this case, writing and holding of data can be performed in a manner similar to the above.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Note that in this specification and the like, it is possible for those skilled in the art to constitute one embodiment of the present invention even when portions to which all the terminals of an active element (e.g., a transistor or a diode), a passive element (e.g., a capacitor or a resistor), or the like are connected are not specified. In other words, one embodiment of the present invention can be clear even when connection portions are not specified. Further, in the case where a connection portion is disclosed in this specification and the like, it can be determined that one embodiment of the present invention in which a connection portion is not specified is disclosed in this specification and the like, in some cases. In particular, in the case where the number of portions to which a terminal is connected might be plural, it is not necessary to specify the portions to which the terminal is connected. Therefore, it is possible to constitute one embodiment of the present invention by specifying only portions to which some of terminals of an active element (e.g., a transistor or a diode), a passive element (e.g., a capacitor or a resistor), or the like are connected.

Note that in this specification and the like, it is possible for those skilled in the art to specify the present invention when at least the connection portion of a circuit is specified. Alternatively, it is possible for those skilled in the art to specify the present invention when at least a function of a circuit is specified. In other words, when a function is specified, one embodiment of the present invention can be clear. Further, it can be determined that one embodiment of the present invention in which a function is specified is disclosed in this specification and the like in some cases. Therefore, when a connection portion of a circuit is specified, the circuit is disclosed as one embodiment of the present invention even when a function of the circuit is not specified, and one embodiment of the present invention can be constructed. Alternatively, when a function of a circuit is specified, the circuit is disclosed as one embodiment of the present invention even when a connection portion is not specified, and one embodiment of the present invention can be constituted.

Note that, in this specification and the like, part of a diagram or a text described in one embodiment can be taken out to constitute one embodiment of the invention. Thus, in the case where a diagram or a text related to a certain part is described, a content taken out from a diagram or a text of the certain part is also disclosed as one embodiment of the invention and can constitute one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that this embodiment can be combined as appropriate with any of the other embodiments in this specification.

Embodiment 4

In this embodiment, configuration examples of a display device using a transistor of one embodiment of the present invention are described.

Structure Example

Figure 9A:
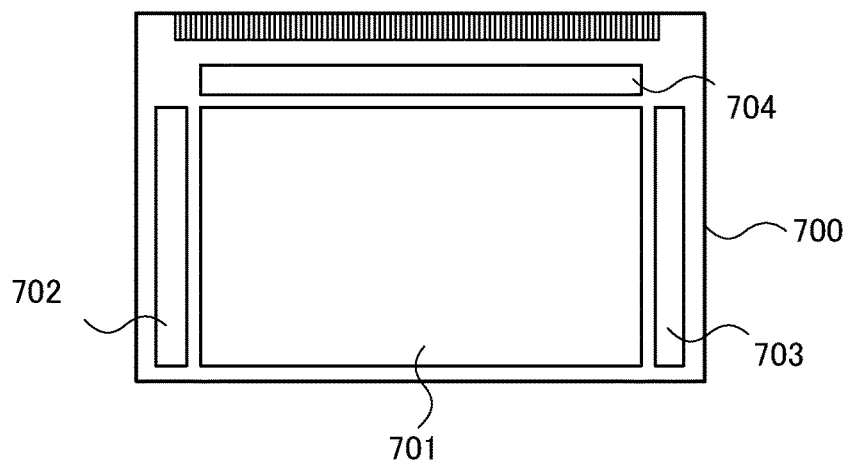
FIGS. 9A to 9C are a top view and circuit diagrams illustrating an example of a display device.
Figure 9B:
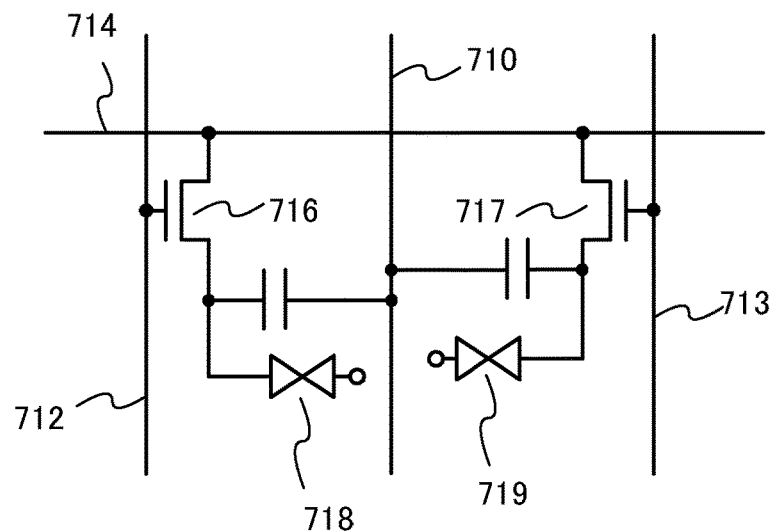
Figure 9C:
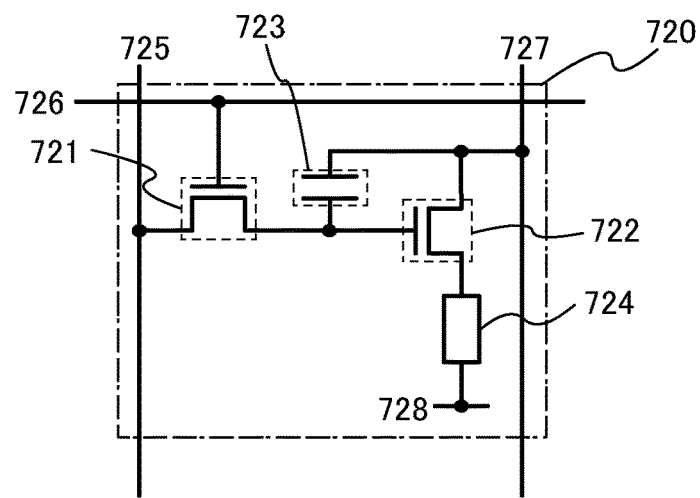

FIG. 9A is a top view of the display device of one embodiment of the present invention. FIG. 9B is a circuit diagram for illustrating a pixel circuit that can be used in the case where a liquid crystal element is used in a pixel in the display device of one embodiment of the present invention. FIG. 9C is a circuit diagram for illustrating a pixel circuit that can be used in the case where an organic EL element is used in a pixel in the display device of one embodiment of the present invention.

The transistor in the pixel portion can be formed in accordance with the above embodiment. Further, the transistor can be easily formed as an n-channel transistor, and thus part of a driver circuit that can be formed using an n-channel transistor can be formed over the same substrate as the transistor of the pixel portion. With the use of the transistor described in the above embodiment for the pixel portion or the driver circuit in this manner, a highly reliable display device can be provided.

FIG. 9A illustrates an example of a top view of an active matrix display device. A pixel portion 701, a first scan line driver circuit 702, a second scan line driver circuit 703, and a signal line driver circuit 704 are provided over a substrate 700 in the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 9A, the first scan line driver circuit 702, the second scan line driver circuit 703, and the signal line driver circuit 704 are formed over the same substrate 700 as the pixel portion 701. Accordingly, the number of components that are provided outside, such as a drive circuit, is reduced, so that a reduction in cost can be achieved. Further, in the case where the driver circuit is provided outside the substrate 700, wirings would need to be extended and the number of connections of wirings would be increased. When the driver circuit is provided over the substrate 700, the number of connections of the wirings can be reduced. Consequently, an improvement in reliability or yield can be achieved.

[Liquid Crystal Display Device]

FIG. 9B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 9B. For example, a switch, a resistor, a capacitor, a transistor, a sensor, a logic circuit, or the like may be added to the pixel illustrated in FIG. 9B.

[Organic EL Display Device]

FIG. 9C illustrates another example of a circuit configuration of the pixel portion. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 9C illustrates an applicable example of a pixel circuit. Here, one pixel includes two n-channel transistors.

Note that the metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 9C. For example, a switch, a resistor, a capacitor, a sensor, a transistor, a logic circuit, or the like may be added to the pixel circuit illustrated in FIG. 9C.

In the case where the transistor shown in the above embodiments is used for the circuit shown in FIGS. 9A to 9C, the source electrode (the first electrode) is electrically connected to the low potential side and the drain electrode (the second electrode) is electrically connected to the high potential side.

For example, in this specification and the like, a display element, a display device which is a device including a display element, a light-emitting element, and a light-emitting device which is a device including a light-emitting element can employ various modes or can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of a display device having an EL element include an EL display and the like. Examples of a display device having an electron emitter include a field emission display (FED), an SED-type flat panel display (SED: surface-conduction electron-emitter display), and the like. Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display) and the like. Examples of a display device having an electronic ink or electrophoretic element include electronic paper.

Note that this embodiment can be combined as appropriate with any of the other embodiments in this specification.

Embodiment 5

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 10A to 10F illustrate specific examples of these electronic devices.

Figure 10A:
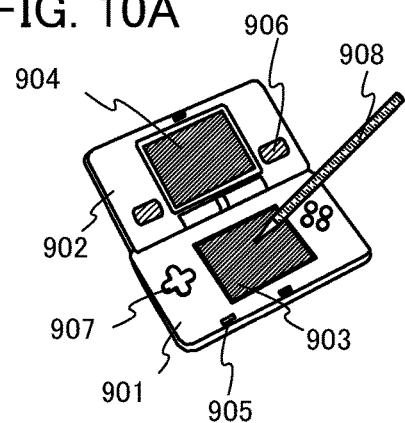
FIGS. 10A to 10F are external views each illustrating an example of an electronic device.

FIG. 10A illustrates a portable game console including a housing 901, a housing 902, a display portion 903, a display portion 904, a microphone 905, a speaker 906, an operation key 907, a stylus 908, and the like. Although the portable game machine in FIG. 10A has the two display portions 903 and 904, the number of display portions included in a portable game machine is not limited to this.

Figure 10B:
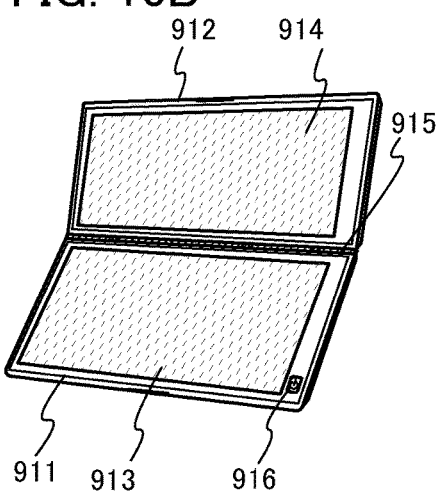

FIG. 10B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel area of a display device.

Figure 10C:
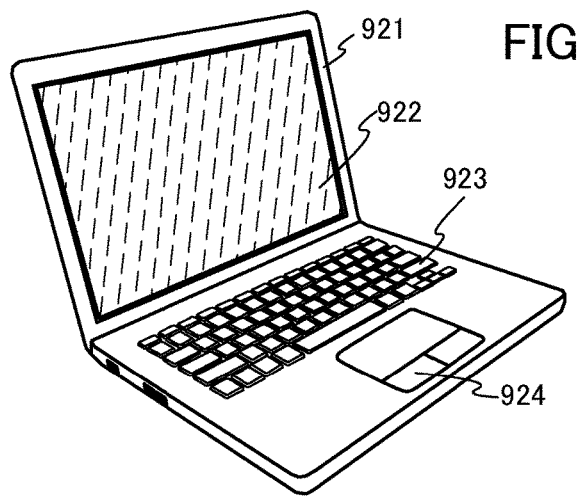

FIG. 10C illustrates a laptop personal computer, which includes a housing 921, a display portion 922, a keyboard 923, a pointing device 924, and the like.

Figure 10D:
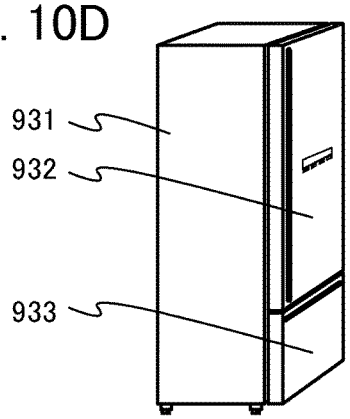

FIG. 10D illustrates the electric refrigerator-freezer including a housing 931, a door for a refrigerator 932, a door for a freezer 933, and the like.

Figure 10E:
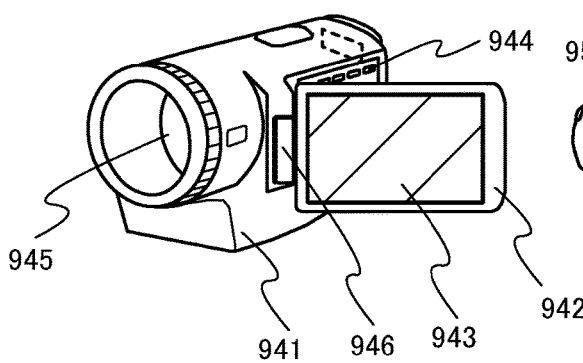

FIG. 10E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 10F:
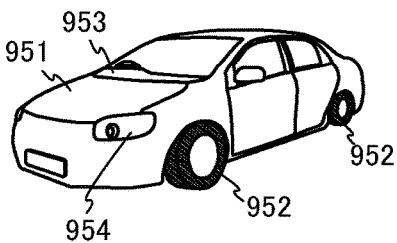
Figure 11A:
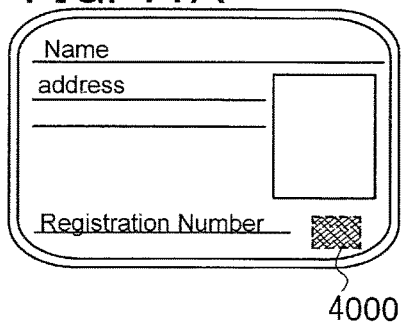
FIGS. 11A to 11F illustrate usage examples of an RFID tag.
Figure 11B:
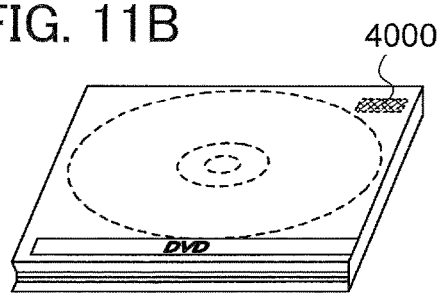
Figure 11C:
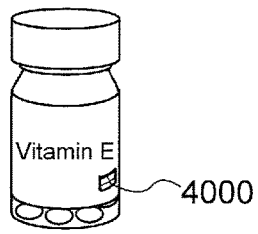
Figure 11D:
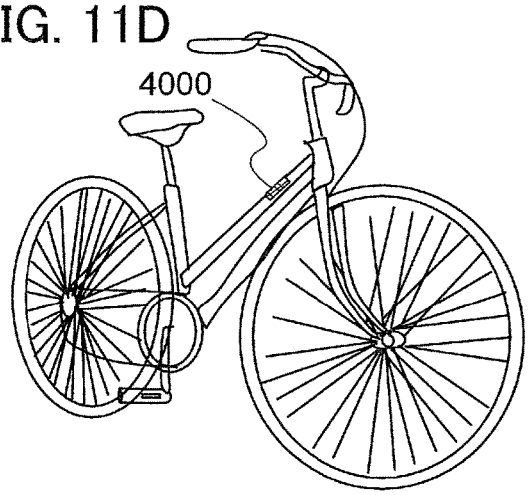
Figure 11E:
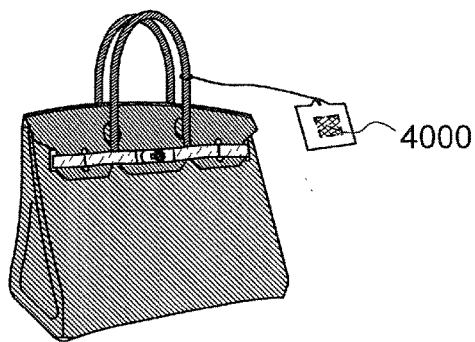
Figure 11F:
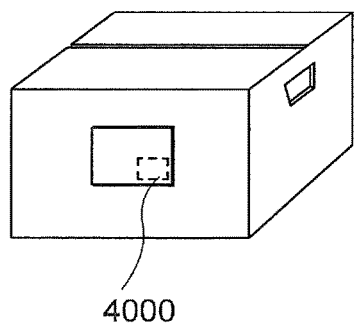

FIG. 10F illustrates a passenger car including a car body 951, wheels 952, a dashboard 953, lights 954, and the like.

Note that this embodiment can be combined as appropriate with any of the other embodiments in this specification.

Embodiment 6

In this embodiment, application examples of an RFID of one embodiment of the present invention are described with reference to FIGS. 11A to 11F. The RFID is widely used and can be provided for, for example, products such as bills, coins, securities, bearer bonds, documents (e.g., driver's licenses or resident's cards, see FIG. 11A), recording media (e.g., DVD software or video tapes, see FIG. 11B), packaging containers (e.g., wrapping paper or bottles, see FIG. 11C), vehicles (e.g., bicycles, see FIG. 11D), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 11E and 11F).

An RFID 4000 of one embodiment of the present invention is fixed to a product by being mounted on a printed wiring board, attached to a surface thereof, or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Further, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

Note that this embodiment can be combined as appropriate with any of the other embodiments in this specification.

This application is based on Japanese Patent Application serial no. 2013-097199 filed with Japan Patent Office on May 3, 2013, the entire contents of which are hereby incorporated by reference.

What is claimed is:

1. A semiconductor device comprising:
a gate electrode layer;
an oxide semiconductor layer including a first region, a second region, and a channel formation region between the first region and the second region;
a gate insulating layer between the gate electrode layer and the oxide semiconductor layer;
a source electrode layer in contact with the first region in the oxide semiconductor layer; and
a drain electrode layer in contact with the second region in the oxide semiconductor layer,
wherein each of the first region, the second region, and the channel formation region overlaps with the gate electrode layer,
wherein each of the first region and the second region comprises donors,
wherein a donor concentration of the channel formation region in the oxide semiconductor layer is lower than or equal to $1 \times 10^{15}/cm^3$,
wherein a donor concentration of each of the first region and the second region is higher than the donor concentration of the channel formation region,
wherein a resistance of each of the first region and the second region is lower than a resistance of the channel formation region, and
wherein a following Formula (1) is satisfied:

$$(E_{c1}-E_{f1})<E_{g1}/2 \qquad (1)$$

where $E_{c1}$, $E_{f1}$, and $E_{g1}$ are energy at a bottom of a conduction band, a Fermi level, and an energy gap at a given point in the channel formation region, respectively.

2. The semiconductor device according to claim 1, wherein the oxide semiconductor layer contains indium, gallium, and zinc.

3. The semiconductor device according to claim 1, wherein the oxide semiconductor layer includes nanocrystal.

4. A semiconductor device comprising:
a gate electrode layer;
an oxide semiconductor layer including a first region, a second region, and a channel formation region between the first region and the second region;
a gate insulating layer between the gate electrode layer and the oxide semiconductor layer;
a source electrode layer in contact with the first region in the oxide semiconductor layer; and
a drain electrode layer in contact with the second region in the oxide semiconductor layer,
wherein each of the first region, the second region, and the channel formation region overlaps with the gate electrode layer,
wherein each of the first region and the second region comprises donors,
wherein a donor concentration of the channel formation region in the oxide semiconductor layer is lower than or equal to $1 \times 10^{15}/cm^3$,
wherein a donor concentration of each of the first region and the second region is higher than the donor concentration of the channel formation region,
wherein a resistance of each of the first region and the second region is lower than a resistance of the channel formation region, and
wherein a following Formula (2) is satisfied:

$$(E_{c2}-E_{f2})<(E_{c1}-E_{f1})<E_{g1}/2 \qquad (2),$$

where $E_{c1}$, $E_{f1}$, and $E_{g1}$ are energy at a bottom of a conduction band, a Fermi level, and an energy gap at a given point in the channel formation region, respectively, and $E_{c2}$ and $E_{f2}$ are energy at the bottom of the conduction band and a Fermi level at a given point in the first region which overlaps with the source electrode layer or the second region which overlaps with the drain electrode layer in the oxide semiconductor layer, respectively.

5. The semiconductor device according to claim 4, wherein the oxide semiconductor layer contains indium, gallium, and zinc.

6. The semiconductor device according to claim 4, wherein the oxide semiconductor layer includes nanocrystal.

7. A semiconductor device comprising:
a gate electrode layer;
an oxide semiconductor layer including a first region, a second region, and a channel formation region between the first region and the second region;
a gate insulating layer between the gate electrode layer and the oxide semiconductor layer;
a source electrode layer in contact with the first region in the oxide semiconductor layer; and a drain electrode layer in contact with the second region in the oxide semiconductor layer, wherein each of the first region, the second region, and the channel formation region overlaps with the gate electrode layer, wherein each of the first region and the second region comprises donors, wherein a donor concentration of the channel formation region in the oxide semiconductor layer is lower than or equal to $1\times10^{13}/\text{cm}^3$, wherein a donor concentration of each of the first region and the second region is higher than the donor concentration of the channel formation region, wherein a resistance of each of the first region and the second region is lower than a resistance of the channel formation region, and wherein a following Formula (3) is satisfied:

$$(E_{c2}-E_{f2}) < (E_{c1}-E_{f1}) \le e(\varphi_m - \chi_{OS} - Q_{GI}/C_{GI}) \quad (3),$$

where $E_{c1}$ and $E_{f1}$ are energy at a bottom of a conduction band and a Fermi level at a given point in the channel formation region, respectively, $E_{c2}$ and $E_{f2}$ are energy at the bottom of the conduction band and a Fermi level at a given point in the first region which overlaps with the source electrode layer or the second region which overlaps with the drain electrode layer in the oxide semiconductor layer, respectively, $\varphi_m$ is a work function of the gate electrode layer, $\chi_{OS}$ is electron affinity of the oxide semiconductor layer, $Q_{GI}$ is a fixed charge of the gate insulating layer, e represents electronic elementary charge, and $C_{GI}$ is capacitance of the gate insulating layer.

8. The semiconductor device according to claim 7, wherein the oxide semiconductor layer contains indium, gallium, and zinc.

9. The semiconductor device according to claim 7, wherein the oxide semiconductor layer includes nanocrystal.

10. A semiconductor device comprising:
a gate electrode layer;
an oxide semiconductor layer including a first region, a second region, and a channel formation region between the first region and the second region;
a gate insulating layer between the gate electrode layer and the oxide semiconductor layer;
a source electrode layer in contact with the first region in the oxide semiconductor layer; and
a drain electrode layer in contact with the second region in the oxide semiconductor layer, wherein each of the first region, the second region, and the channel formation region overlaps with the gate electrode layer, wherein each of the first region and the second region comprises donors, wherein a carrier concentration of the channel formation region in the oxide semiconductor layer is lower than or equal to $1\times10^{15}/\text{cm}^3$ when a potential of 0 V is applied to the gate electrode layer, wherein a donor concentration of each of the first region and the second region is higher than the donor concentration of the channel formation region, wherein a resistance of each of the first region and the second region is lower than a resistance of the channel formation region, and wherein a following Formula (1) is satisfied:

$$(E_{c1}-E_{f1}) < E_{g1}/2 \quad (1)$$

where $E_{c1}$, $E_{f1}$, and $E_{g1}$ are energy at a bottom of a conduction band, a Fermi level, and an energy gap at a given point in the channel formation region, respectively.

11. The semiconductor device according to claim 10, wherein the oxide semiconductor layer contains indium, gallium, and zinc.

12. The semiconductor device according to claim 10, wherein the oxide semiconductor layer includes nanocrystal.

13. The semiconductor device according to claim 1, wherein the donor concentration of each of the first region and the second region is higher than or equal to $5\times10^{18}/\text{cm}^3$.

14. The semiconductor device according to claim 4, wherein the donor concentration of each of the first region and the second region is higher than or equal to $5\times10^{18}/\text{cm}^3$.

15. The semiconductor device according to claim 7, wherein the donor concentration of each of the first region and the second region is higher than or equal to $5\times10^{18}/\text{cm}^3$.

16. The semiconductor device according to claim 10, wherein the donor concentration of each of the first region and the second region is higher than or equal to $5\times10^{18}/\text{cm}^3$.

* * * * *